(12) United States Patent
Utsunomiya et al.

(10) Patent No.: US 7,991,073 B2
(45) Date of Patent: Aug. 2, 2011

(54) DISTORTION COMPENSATION APPARATUS AND METHOD

(75) Inventors: Yuichi Utsunomiya, Kawasaki (JP);
Hajime Hamada, Kawasaki (JP);
Hiroyoshi Ishikawa, Kawasaki (JP);
Nobukazu Fudaba, Kawasaki (JP);
Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/639,510

(22) Filed: Dec. 16, 2009

(65) Prior Publication Data
US 2010/0156530 A1  Jun. 24, 2010

(30) Foreign Application Priority Data

Dec. 18, 2008  (JP) ................ 2008-322791

(51) Int. Cl.
*H04L 25/49* (2006.01)
*H03K 7/00* (2006.01)
(52) U.S. Cl. .......... 375/296; 375/297; 332/107
(58) Field of Classification Search .......... 375/285, 375/295–297; 332/106, 107, 123, 159, 160, 332/124, 125; 455/114.2, 114.3
See application file for complete search history.

(56) References Cited

U.S. PATENT DOCUMENTS

| | | | |
|---|---|---|---|
| 6,552,609 B2 * | 4/2003 | Hamada et al. | 330/149 |
| 6,744,315 B2 * | 6/2004 | Ezuka | 330/149 |
| 7,289,773 B2 | 10/2007 | Braithwaite | |
| 7,746,167 B1 * | 6/2010 | Summerfield | 330/149 |
| 2002/0041208 A1 | 4/2002 | Hamada et al. | |
| 2006/0232332 A1 | 10/2006 | Braithwaite | |

FOREIGN PATENT DOCUMENTS

| | | |
|---|---|---|
| EP | 1 858 158 A1 | 11/2007 |
| JP | 2001-60903 | 3/2001 |
| JP | 2002-359655 | 12/2002 |
| WO | WO 01/08296 A1 | 2/2001 |

OTHER PUBLICATIONS

Communication dated Apr. 8, 2010 from the European Patent Office in the related European application No. 09177251.7-1233.
Matthews, V. John, et al., "Polynomial signal processing", John Wiley & Sons, Inc. (2000), pp. 68-75.
Haykin, S., "Adaptive Filter Theory", Prentice Hall, Inc. (1996), pp. 364-373 and 562-573.
Matthews, V. John, "Adaptive Polynomial Filters", IEEE Signal Processing Magazine, Jul. 1991, pp. 10-26.

* cited by examiner

*Primary Examiner* — Tesfaldet Bocure
(74) *Attorney, Agent, or Firm* — Staas & Halsey LLP

(57) ABSTRACT

A distortion compensation apparatus includes a distortion compensation unit that performs distortion compensation processing on a transmission signal by a series operation, a coefficient update unit that updates a group of series operation coefficients used for the series operation based on a feedback signal of transmission signal output that is output after power amplification processing is performed on output of the distortion compensation unit and the transmission signal, an initial coefficient memory that stores the groups of series operation coefficients that become initial values for coefficient update processing by the coefficient update unit, and a power fluctuation detection unit that detects a power fluctuation of the transmission signal and, when the power fluctuation is detected, reads the groups of series operation coefficients from the initial coefficient memory and provides the groups of series operation coefficients to the coefficient update unit.

22 Claims, 14 Drawing Sheets

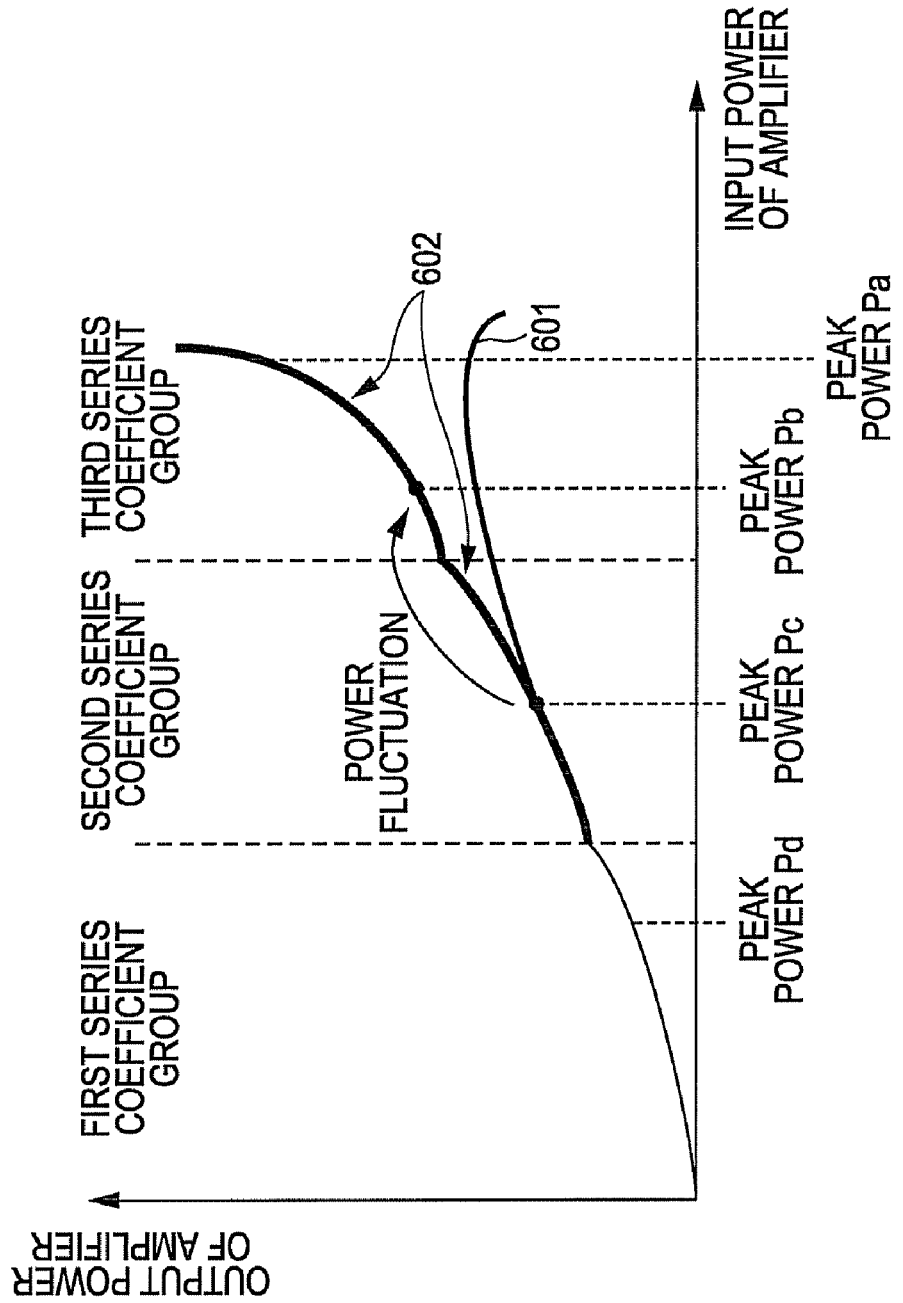

| PEAK POWER AFTER FLUCTUATION | OMISSIBLE COEFFICIENT |
|---|---|
| Pd | D2, D3 |
| Pc | C3 |
| Pb | — |
| Pa | — |

OMISSIBLE

| PEAK POWER BEFORE FLUCTUATION | PEAK POWER AFTER FLUCTUATION | COEFFICIENT TO BE SUBSTITUTED AFTER FLUCTUATION | OMISSIBLE COEFFICIENT |
|---|---|---|---|
| Pd | Pc | C1, C2, C3 | — |
| Pc | Pb or Pa | B2, B3 | B1 |
| Pb | Pa | A3 | A1, A2 |
| Pa | Pa | A3 | A1, A2 |

DISTORTION COMPENSATION APPARATUS AND METHOD

CROSS-REFERENCE TO RELATED APPLICATION

This application is based upon and claims the benefit of priority of the prior Japanese Patent Application No. 2008-322791, filed on Dec. 18, 2008, the entire contents of which are incorporated herein by reference.

BACKGROUND

Embodiments of the present invention relate to a pre-distortion type distortion compensation technology to suppress nonlinear distortion of transmission amplifier output by performing distortion compensation processing on an input signal into a transmission amplifier in advance in radio communication.

Generally, a high-efficiency transmission amplifier used in a radio transmission apparatus such as a mobile base station has strong nonlinear characteristics. Thus, when a modulating signal for high-speed radio communication is transmitted, such nonlinear distortion in the transmission amplifier causes out-of-band radiation power in the transmission modulating signal, affecting adjacent transmission channels.

As a method for suppressing out-of-band radiation by a transmission amplifier, a pre-distortion method is known by which nonlinear distortion in the transmission amplifier is compensated for by adding a distortion signal having characteristics opposite to nonlinear distortion characteristics of the transmission amplifier to an input signal before the input signal is input into the transmission amplifier. Particularly, an adaptive pre-distortion method by which distortion compensation is adaptively made by giving feedback of output of the transmission amplifier to the input side may suppress out-of-band radiation.

FIG. 12 is a diagram of principle of the pre-distortion method. In the transmission amplifier, output is normally saturated with increasing input power so that a linear signal may not be output in response to an input signal (1201 in FIG. 12). Nonlinear characteristics of the amplifier have a harmful influence described below.

That is, nonlinear characteristics of the transmission amplifier cause for amplifier input radiation of unnecessary spectra out of the signal band. The out-of-band radiation power deteriorates characteristics of other systems using out-of-band frequencies. Moreover, unnecessary spectra are radiated in the signal band as well. Such radiation causes characteristic deterioration of the signal itself.

Further, most current digital modulation methods require linear amplification characteristics and thus, when an amplifier having the above saturation characteristics is used, the use of a linear low input power portion is unavoidable. This leads to lower power efficiency of the transmission amplifier.

Therefore, characteristics opposite to amplifier characteristics are applied to an input signal of the transmission amplifier using the pre-distortion technology (1202 in FIG. 12). With the addition of such nonlinear amplifier characteristics, as indicated by 1203 in FIG. 12, compensated linear characteristics may be obtained as resultant transmission amplifier output.

As a method of pre-distortion, a pre-distortion method using power series has been proposed. This is a method, as illustrated in FIG. 13, by which a compensation operation in a pre-distortion unit 1301 prior to the transmission amplifier is performed by a power series operation on an input signal x.

That is, the pre-distortion unit 1301 in FIG. 13 makes compensation for distortion of a transmission amplifier 1305 by performing a power series operation on the input signal x. Output of the pre-distortion unit 1301 is converted into an analog signal by a D/A converter 1302 and further quadrature-modulated by a quadrature modulator 1303 based on a signal oscillated by a local oscillator 1304 in accordance with a transmission base station.

The modulated transmission analog signal is power-amplified by the transmission amplifier 1305 and output thereof is supplied to a transmission antenna 1307 via a coupler 1306 before transmission from there.

Moreover, feedback of output of the transmission amplifier 1305 is given to the input side from the coupler 1306.

That is, output of the coupler 1306 is down-converted by a down-converter 1308 based on a signal oscillated by a local oscillator 1309 in accordance with a transmission base station. Output thereof is further converted back to a digital signal by an ND converter 1310 before being restored to a base band by a demodulator.

An error signal e(n) of a resultant feedback signal Sfb(n) from a transmission signal Sref(n) delayed by a delay circuit is calculated by a subtracter 1311.

Then, power series operation coefficients a, b, c, and d to be supplied to the pre-distortion unit 1301 are updated by a coefficient update unit 1312 so that the error signal e(n) is minimized based on the least mean square operation.

Power series operation coefficients are gradually converged to predetermined values in this manner and a power series operation on the input signal x is performed by the pre-distortion unit 1301 using the power series operation coefficients that have converged to the predetermined values. Accordingly, in a steady state, nonlinear distortion characteristics in an analog circuit unit are suppressed with precision while high power efficiency is retained. Then, even if the nonlinear distortion characteristics fluctuate due to an influence of temperature or frequency, an analog gain fluctuation amount thereof is detected by the feedback signal Sfb(n). Then, values of power series operation coefficients are updated in a compensating direction of the fluctuation amount by the coefficient update unit 1312 so that characteristic fluctuations may dynamically be compensated for.

The above configuration actually has a configuration for a complex signal.

In the above configuration of conventional technology, it is assumed, for example, that two sine wave signals (2-tone signal) a frequency $2\Delta f$ apart from each other represented by the following formula are input into an amplifier model that is modeled by power series:

$$\cos 2\pi(fc-\Delta f)t + \cos 2\pi(fc+\Delta f)t, \text{ where fc is a carrier frequency.}$$

As a result, even-order power terms of an output signal represented by power series contain only signal components that are significantly detuned from the carrier frequency fc and suppressed by a filter of the analog unit or the transmission amplifier itself. In contrast, unnecessary components arise near the carrier frequency such as $fc \pm 3\Delta f$ for a tertiary power term and $fc \pm 5\Delta f$ for a quintic power term. Therefore, nonlinear distortion in the transmission amplifier 1305 may be modeled by power series having only odd-order power terms. Thus, as illustrated in FIG. 13, power series to be processed by the pre-distortion unit 1301 are also generally composed of odd-order power terms only.

Hereinafter, a simple power series formula $ax+bx^3+cx^5+dx^7$ will be used as a power series formula for the sake of simplicity. For actual distortion compensation, more complex series that take delay components into consideration including Volterra series are generally used to model characteristics of the transmission amplifier 1305 more accurately (see, for example, V. J. Mathews and G. L. Sicuranza: "Polynomial Signal Processing", John Wiley&Sons, Inc. (2000)).

Generally, electric energy of a transmission signal changes in a transmission apparatus in a radio communication system depending on utilization conditions of the user. In a distortion compensation method by conventional power series described above, there is a problem that out-of-band radiation power temporarily rises unless optimal distortion compensation coefficients are used immediately after power of a transmission signal fluctuates.

If, for example, distortion compensation coefficients are updated in a state in which the peak power of a transmission signal is "peak power 1" in FIG. 14, a difference arises between a correction curve 1403 in a region (thick line) where no signal arises for amplifier characteristics 1401 and an ideal correction curve 1402. If, in this state, the peak power of a transmission signal changes to "peak power 2", coefficient characteristics 1404 before the signal changes will be used for distortion compensation operation. As a result, correction curves 1403 and 1404 deviate from the ideal correction curve 1402 until the coefficients are updated and thus, there is a problem that adequate performance for distortion compensation may not be maintained.

SUMMARY

A distortion compensation apparatus includes a distortion compensation unit that performs distortion compensation processing on a transmission signal by a series operation, a coefficient update unit that updates a group of series operation coefficients used for the series operation based on a feedback signal of transmission signal output that is output after power amplification processing is performed on output of the distortion compensation unit and the transmission signal, an initial coefficient memory that stores the groups of series operation coefficients that become initial values for coefficient update processing by the coefficient update unit, and a power fluctuation detection unit that detects a power fluctuation of the transmission signal and, when the power fluctuation is detected, reads the groups of series operation coefficients from the initial coefficient memory and provides the groups of series operation coefficients to the coefficient update unit.

It is to be understood that both the foregoing general description and the following detailed description are exemplary and explanatory, and are not restrictive of the embodiments as claimed.

BRIEF DESCRIPTION OF DRAWINGS

FIG. 6 is an explanatory view of operation in the fourth embodiment;

DETAILED DESCRIPTION OF EMBODIMENTS

Embodiments of the distortion compensation apparatus will be described below in detail with reference to the drawings.

According to the technology disclosed below, when fluctuations in peak power or average power of a transmission signal are detected by a power fluctuation detection circuit during operation, power series operation coefficients stored in a memory in advance are read and set to the pre-distortion unit to perform a distortion compensation operation.

The function of the pre-distortion unit and the like of the distortion compensation apparatus is implemented in, for example, a DSP (Digital Signal Processor) for realization.

First Embodiment

Figure 1:
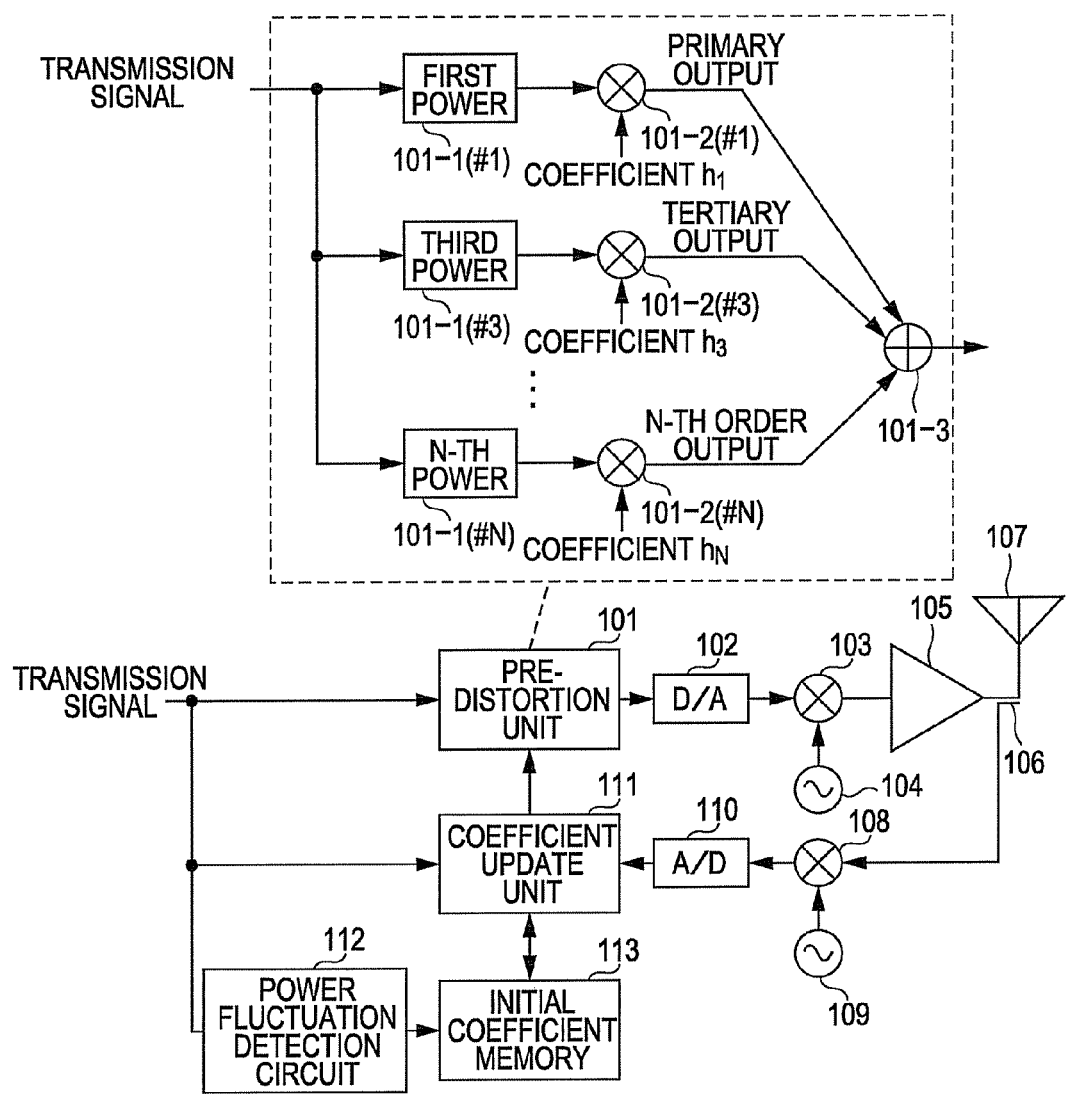
FIG. 1 is a configuration diagram in a first embodiment of a distortion compensation apparatus.

FIG. 1 is a configuration diagram in the first embodiment of a distortion compensation apparatus.

A pre-distortion unit 101 performs a power series operation consisting of odd-order power terms and is constituted by a power computing unit 101-1, a coefficient multiplier 101-2, and an accumulator 101-3. The pre-distortion unit 101 makes thereby distortion compensation of the transmission amplifier 105.

Output of the pre-distortion unit 101 is converted into an analog signal by a D/A converter 102 and further quadrature-modulated by a quadrature modulator 103 based on a signal oscillated by a local oscillator 104 in accordance with a transmission base station.

The modulated transmission analog signal is power-amplified by the transmission amplifier 105 and output thereof is supplied to a transmission antenna 107 via a coupler 106 before transmission from there.

Moreover, feedback of output of the transmission amplifier 105 is given to the input side from the coupler 106.

That is, output of the coupler 106 is down-converted by a down-converter 108 based on a signal oscillated by a local oscillator 109 in accordance with a transmission base station. Output thereof is further converted back to a digital signal by an ND converter 110 before being restored to a base band by a demodulator.

An error signal of a resultant feedback signal from a transmission signal is calculated by a coefficient update unit 111 and a group of power series operation coefficients to be supplied to the pre-distortion unit 101 is updated so that the error signal is minimized based on the least mean square operation.

If a power fluctuation detection circuit 112 detects a power fluctuation of a transmission signal during operation, the power fluctuation detection circuit 112 reads distortion compensation coefficients stored in an initial coefficient memory 113 in advance and inputs the distortion compensation coefficients into the coefficient update unit 111. The distortion compensation coefficients stored in the initial coefficient memory 113 are calculated, for example, when shipped from a factory. In the present embodiment, the coefficient update unit 111 may thereby use values matching power of a transmission signal as initial values for coefficient update processing when a power fluctuation is detected and thus, coefficients are efficiently updated and a state close to an ideal correction curve may swiftly be achieved. Therefore, distortion compensation may be made also immediately after power of a transmission signal fluctuates in a state close to an ideal correction curve so that the rise in out-of-band radiation power may be suppressed. While the power fluctuation detection circuit 112 detects a power fluctuation based on, for example, peak power, average power or the like, the peak power will be used for the description below. The average power may similarly be used.

When the power fluctuation is detected, the coefficient update unit 111 overwrites a group of power series operation coefficients held until then with a group of distortion compensation coefficients read from the memory and inputs the group of distortion compensation coefficients into the pre-distortion unit 101. Coefficient update processing thereafter is performed using the read group of distortion compensation coefficients as initial values. Accordingly, initial values of coefficient update processing by the coefficient update unit 111 are updated when appropriate so that the initial values become values matching utilization conditions or the like.

Second Embodiment

Figure 2:
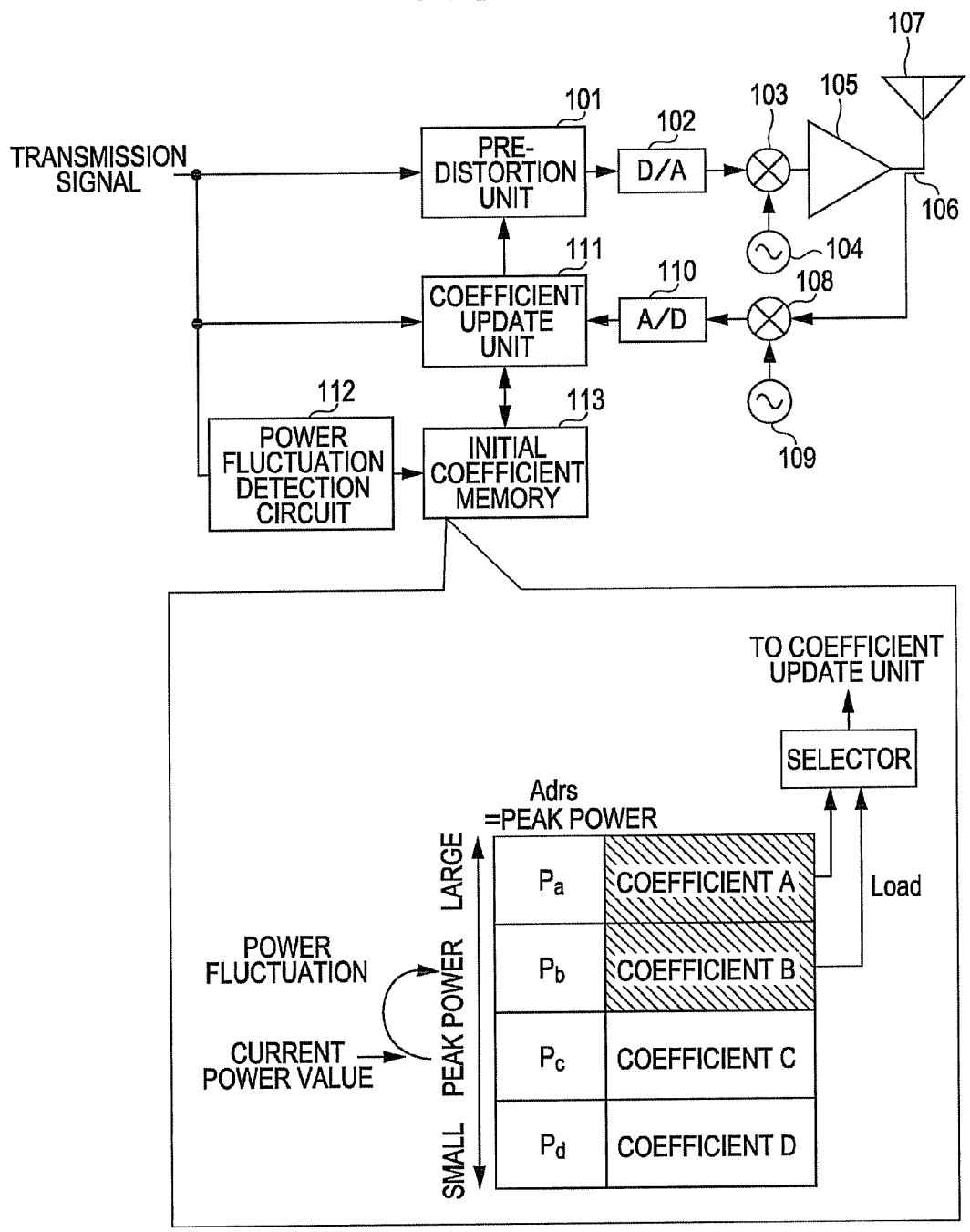
FIG. 2 is a configuration diagram in a second embodiment of the distortion compensation apparatus.

FIG. 2 is a configuration diagram in the second embodiment of the distortion compensation apparatus. The second embodiment is different from the first embodiment in FIG. 1 in the configuration concerning distortion compensation coefficients stored in the initial coefficient memory 113. In FIG. 2, the same numbers are attached to the same units as those in FIG. 1.

In the present embodiment, as illustrated in FIG. 2, the initial coefficient memory 113 stores a corresponding group of power series operation coefficients for each power level of a transmission signal. In the example in FIG. 2, corresponding coefficients A, B, C, and D for the four power levels (levels of peak power are Pa, Pb, Pc, and Pd) are stored. Each coefficient is a group of power series operation coefficients. FIG. 2 illustrates an example in which the peak power of a transmission signal fluctuates from Pc to Pb. The coefficient (the coefficient A or coefficient B) corresponding to the peak power equivalent to power after the power fluctuation or more is read from the initial coefficient memory 113 and input into the coefficient update unit 111.

In the present embodiment, the amount of memory increases because each peak power coefficient is held, but an increase in out-of-band radiation power during power fluctuation may be suppressed because coefficients matching power of a transmission signal may be used.

Third Embodiment

Figure 3:
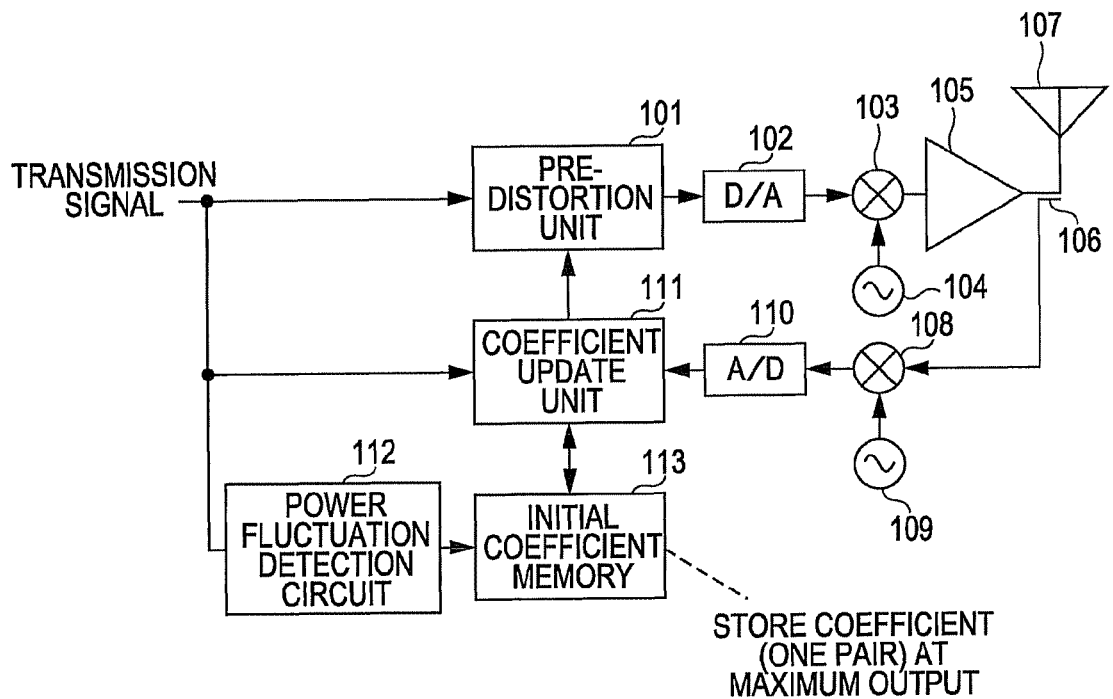
FIG. 3 is a configuration diagram in a third embodiment of the distortion compensation apparatus.

FIG. 3 is a configuration diagram in the third embodiment of the distortion compensation apparatus. The third embodiment is different from the first embodiment in FIG. 1 in the configuration concerning distortion compensation coefficients stored in the initial coefficient memory 113. In FIG. 3, the same numbers are attached to the same units as those in FIG. 1.

In FIG. 3, only a coefficient corresponding to the maximum output power of the transmission amplifier 105 is held in the initial coefficient memory 113. Then, when a power fluctuation occurs, the coefficient corresponding to the maximum output power is read from the initial coefficient memory 113 regardless of the power value after the fluctuation and input into the coefficient update unit 111.

In the present embodiment, an increase in out-of-band radiation power becomes greater than in the second embodiment by holding only one group of coefficients in the initial coefficient memory 113, but the amount of memory may be reduced within a reasonable range.

Fourth Embodiment

Figure 4:
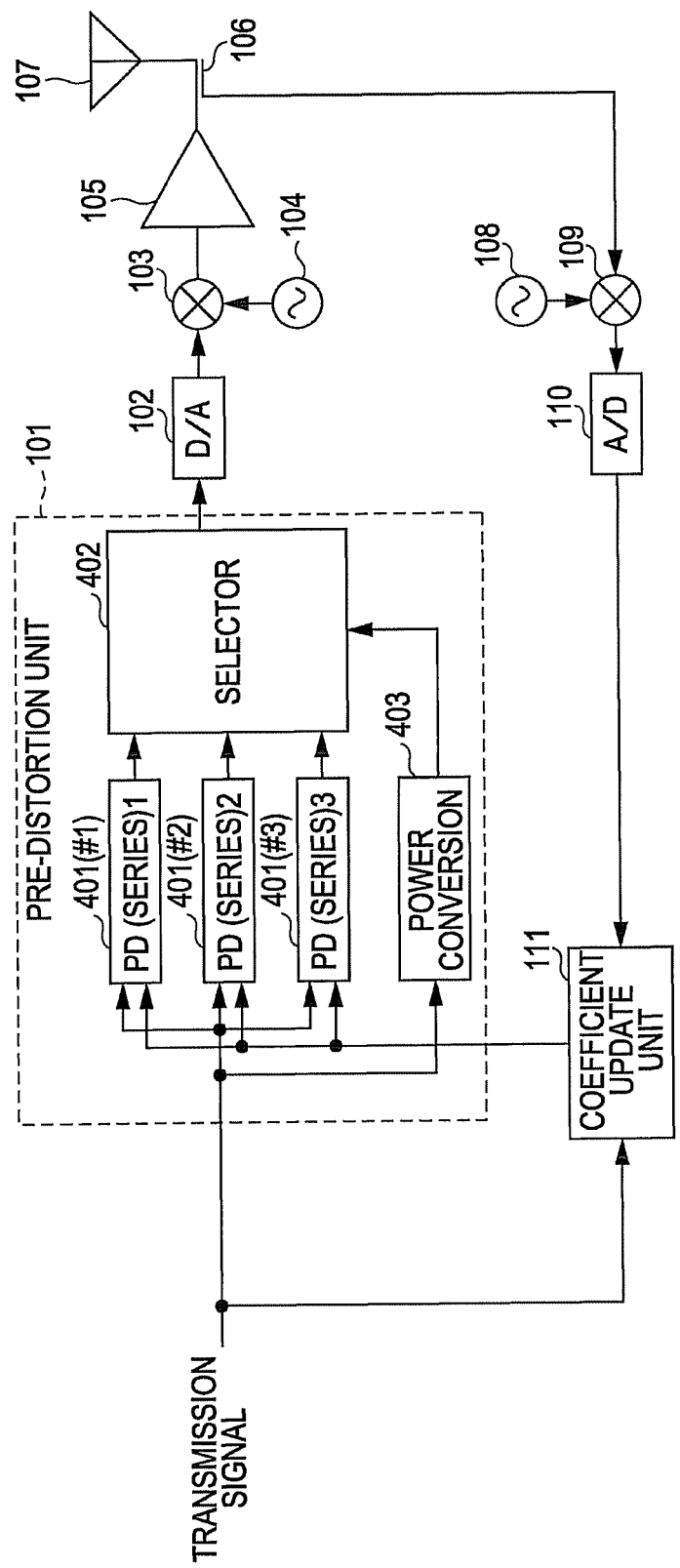
FIG. 4 is a configuration diagram of a pre-distortion method using a plurality of power series on which a fourth embodiment of the distortion compensation apparatus is based.
Figure 13:
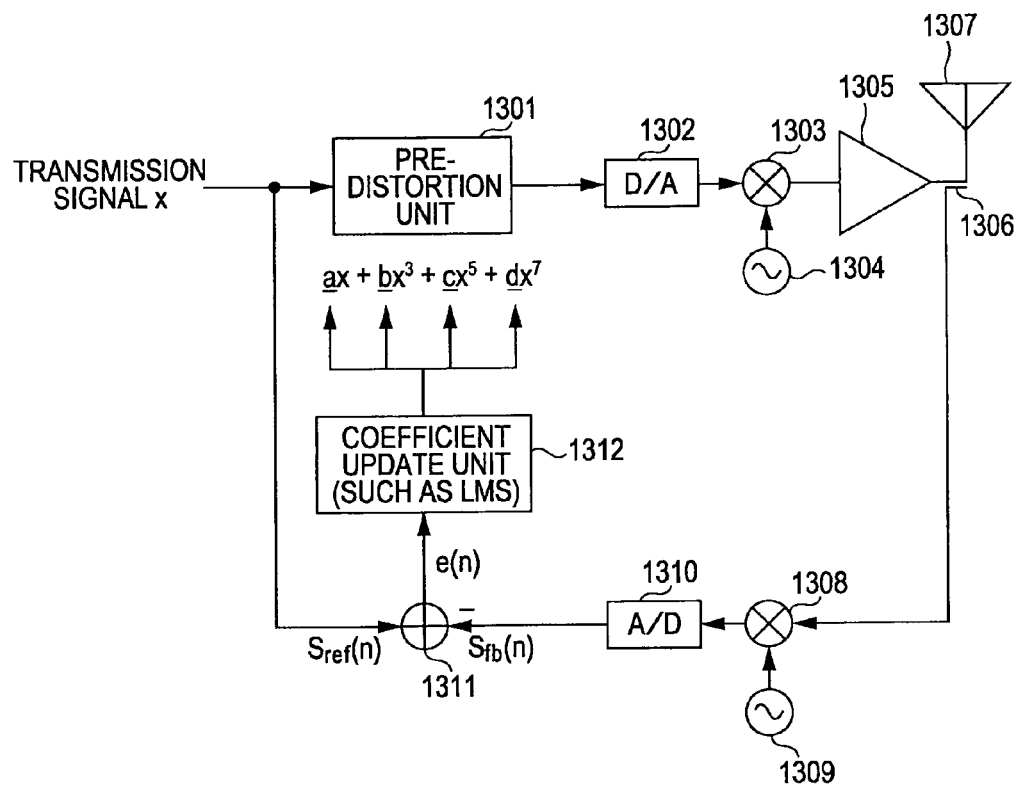
FIG. 13 is a configuration diagram of a conventional distortion compensation apparatus.
Figure 14:
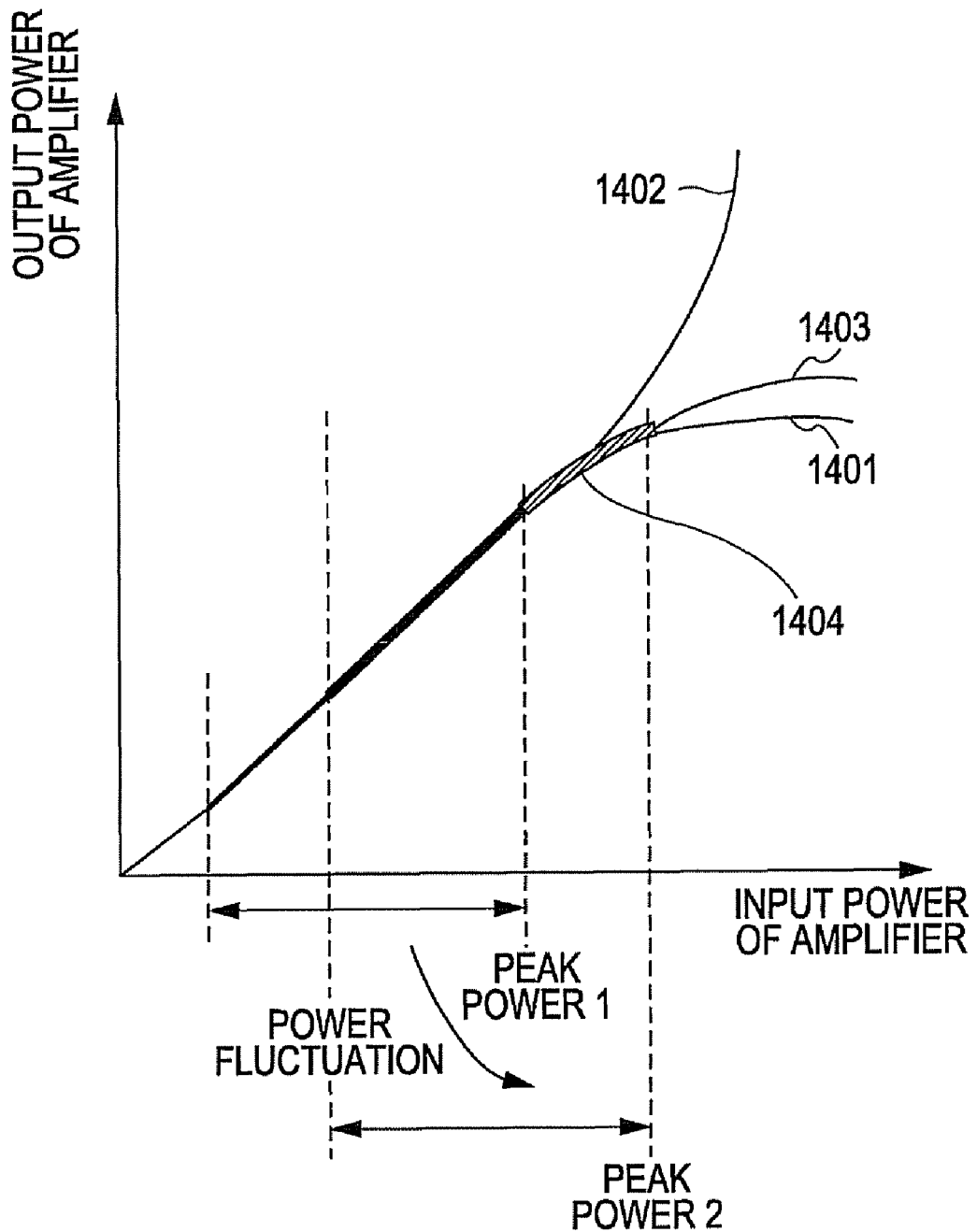
FIG. 14 is an explanatory view of deterioration in spectrum characteristics caused by nonlinear characteristics of a transmission amplifier.

FIG. 4 is a configuration diagram of a pre-distortion method using a plurality of power series on which the fourth embodiment of the distortion compensation apparatus is based. This configuration relates to a method for improving distortion compensation performance of the single power series pre-distortion method illustrated in FIG. 13. In FIG. 4, the same numbers are attached to the same units as those in FIG. 1.

In the configuration in FIG. 4, a plurality of pre-distortion units (PD units) 401 configured by power series operations is prepared like #1, #2, and #3 and each PD unit 401 performs different power series operations based on different power series operation coefficient groups.

A selector 402 holds {(number of the PD units 401)−1} power thresholds and compares a power signal value obtained by converting power of a transmission signal by a power conversion unit 403 with each power threshold. Then, the selector 402 selects output of the PD unit 401 corresponding to the comparison result and outputs the output to the D/A converter 102.

Figure 5:
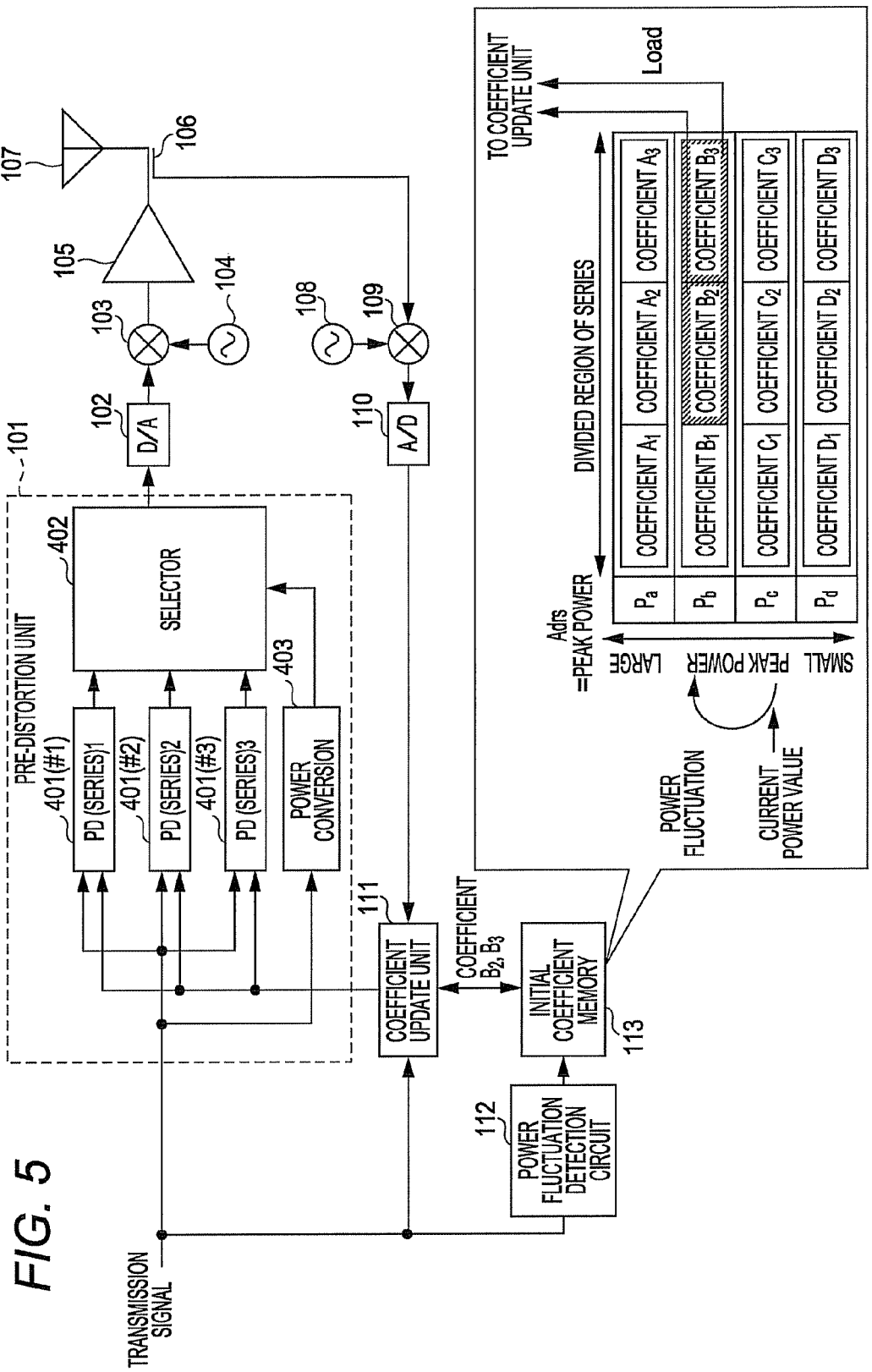
FIG. 5 is a configuration diagram in the fourth embodiment of the distortion compensation apparatus.

FIG. 5 is a configuration diagram in the fourth embodiment of the distortion compensation apparatus based on the configuration of the pre-distortion method using a plurality of power series illustrated in FIG. 4. The fourth embodiment is achieved by applying the PD unit 401 in FIG. 4 to the first embodiment in FIG. 1. In FIG. 5, the same numbers are attached to the same units as those in FIGS. 1 and 4.

In this embodiment, the coefficient group (group of power series operation coefficients) corresponding to each of a plurality of PD units 401 is stored in the initial coefficient memory 113 for each of a plurality of peak power values.

FIG. 6 is an explanatory view of operation in the fourth embodiment.

The fourth embodiment has, as illustrated in FIG. 6, a plurality of characteristics (three in FIG. 6) as correction characteristics of the output power with respect to an input power of the transmission amplifier 105 corresponding to distortion compensation operations by a plurality of power series operations.

When a power fluctuation occurs, coefficient groups of a region where the correction curve is shifted, that is, a region containing the peak power before the change and a power region exceeding the peak power are changed.

Assume, for example, that the distortion compensation apparatus in FIG. 5 operates with peak power Pc. If coefficients are updated in this state, a shift from an ideal distortion compensation curve arises in a region 601 without signal (see FIG. 6). If the power fluctuates to Pb, a group of distortion compensation coefficients corresponding to characteristics

601 that are shifted in a region above Pc are used and thus, out-of-band radiation power rises. Therefore, of the group of initial coefficients corresponding to the peak power Pb, second and third series coefficient groups (coefficient groups B2 and B3 in FIG. 5 corresponding to characteristics 602 in FIG. 6) where shifts arise are read from the initial coefficient memory 113 and provided to the coefficient update unit 111.

Figures 7A, 7B:
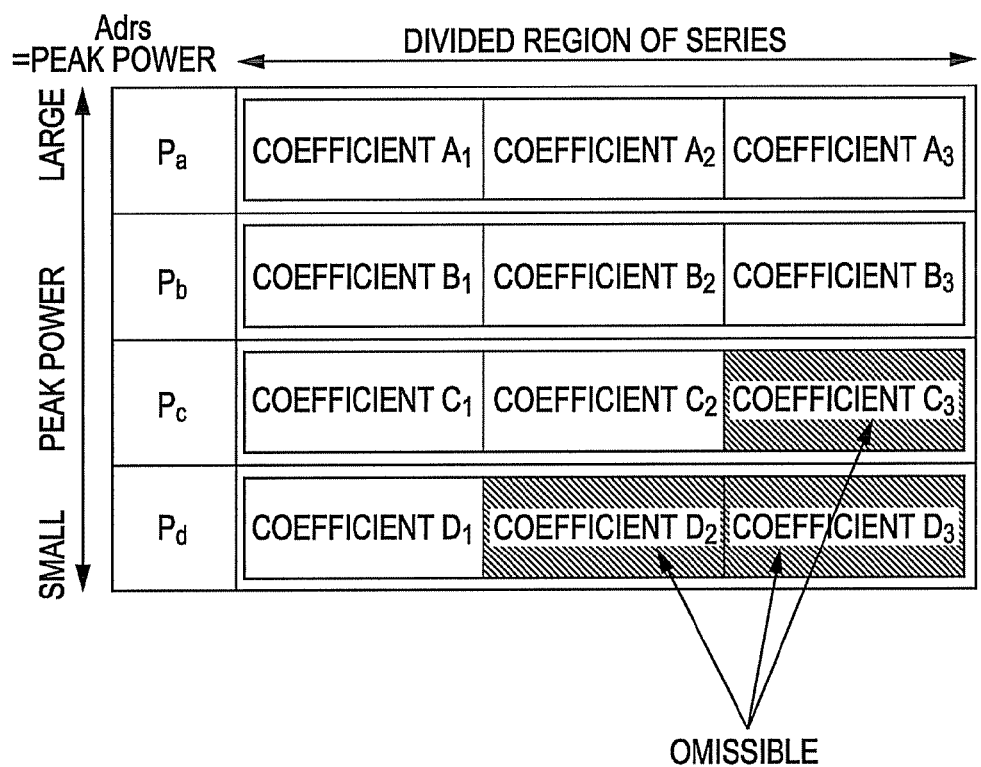
FIGS. 7A-7B are an explanatory view (Part 1) when a group of coefficients is omitted in the fourth embodiment.

Since a region that exceeds the peak power after a fluctuation and does not contain the peak power after the fluctuation has no signal present therein, coefficient groups held in the initial coefficient memory 113 may be omitted. In the fourth embodiment, coefficient groups illustrated in FIGS. 7A and 7B may be omitted for each peak power value, leading to a reduced amount of memory.

Figures 8A, 8B:
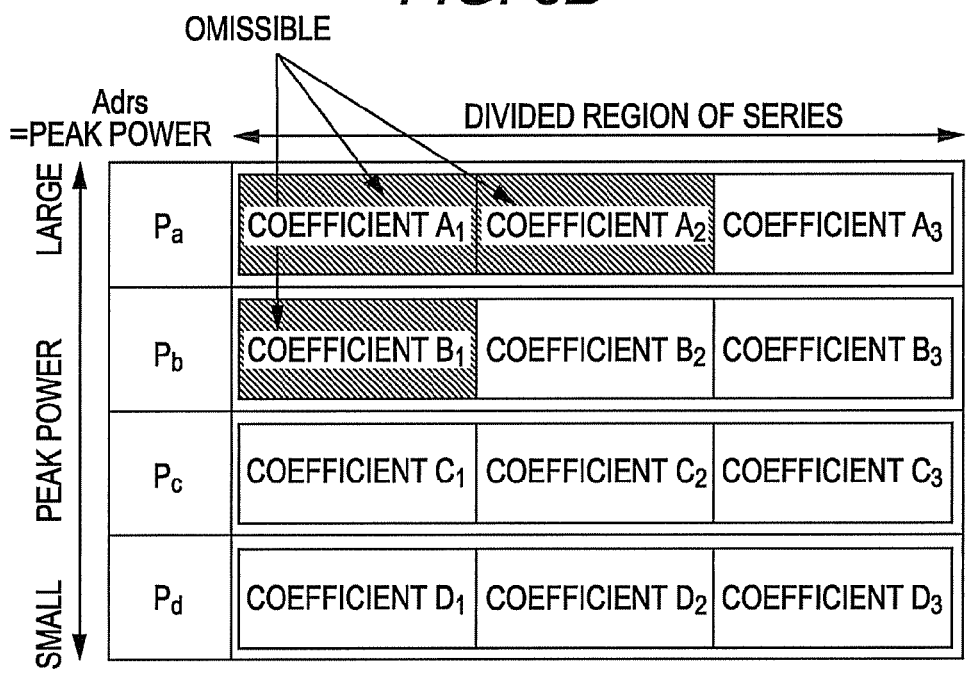
FIGS. 8A-8B are an explanatory view (Part 2) when the group of coefficients is omitted in the fourth embodiment.

Since a region that is equal to or below the peak power before a power fluctuation and does not contain the peak power before the power fluctuation has a correction curve created based on a signal before the power fluctuation, there is no need to change coefficient groups when a power fluctuation occurs. Thus, only coefficient groups corresponding to a region containing the peak power before a power fluctuation occurs and exceeding the peak power need to be held in the initial coefficient memory 113 and those corresponding to a region below the peak power may be omitted. In the fourth embodiment, for example, if the amount of power fluctuation is equal to or less than one divided region, coefficient groups illustrated in FIGS. 8A and 8B may be omitted for each peak power value, leading to a reduced amount of memory.

Further, if a lower limit of peak power is known, a correction curve is created in a region below the lower limit for the same reason as above and thus, coefficient groups may be omitted. If, for example, the lower limit of peak power is Pc in the fourth embodiment, coefficients to be changed when a power fluctuation occurs include only one of the second and third series or both and thus, coefficients A1, B1, C1, and D1 corresponding to the first series may be omitted.

Fifth Embodiment

Figure 9:
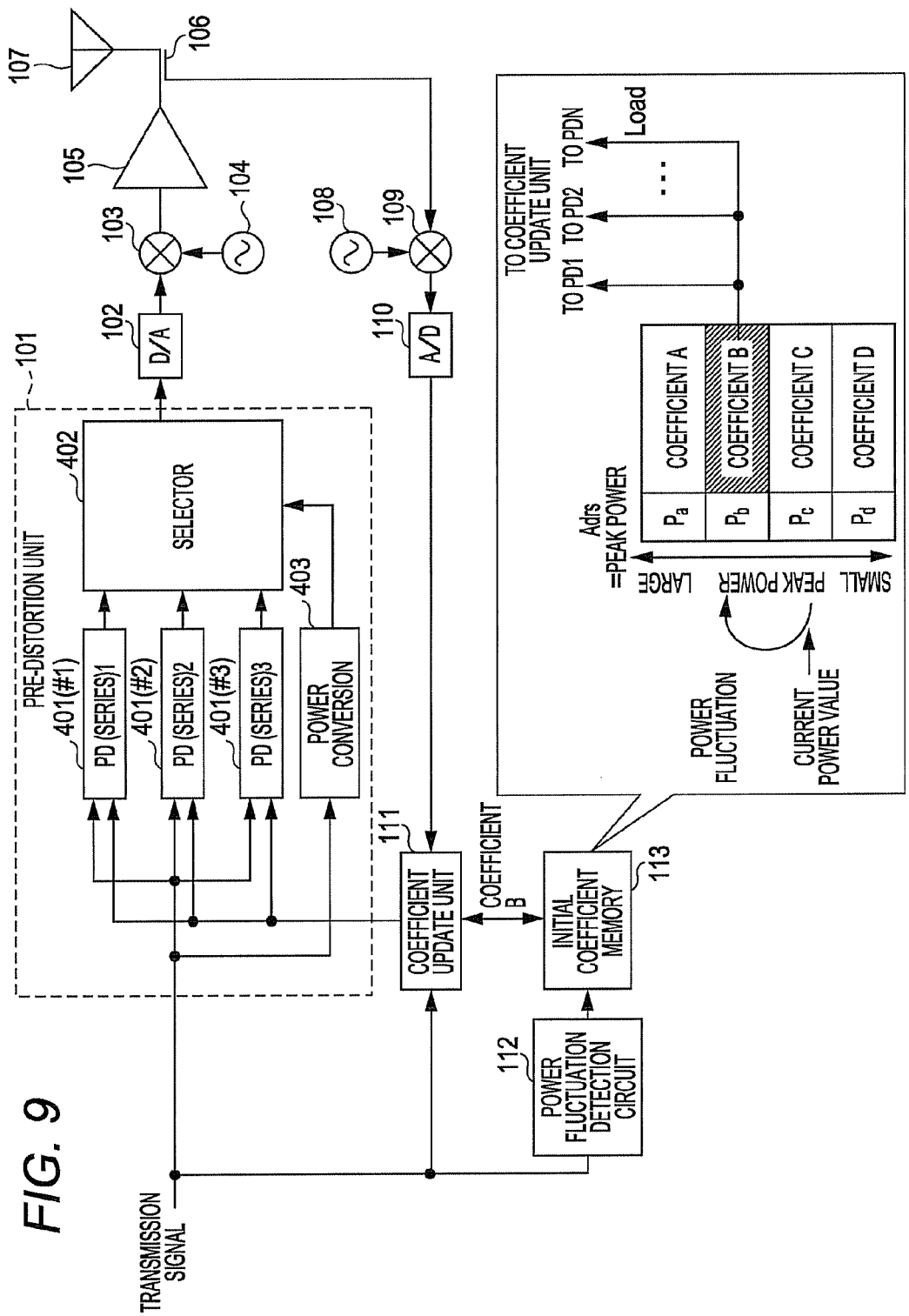
FIG. 9 is a configuration diagram in a fifth embodiment of the distortion compensation apparatus.

FIG. 9 is a configuration diagram in the fifth embodiment of the distortion compensation apparatus. The fifth embodiment is different from the fourth embodiment in FIG. 5 in the configuration concerning distortion compensation coefficients stored in the initial coefficient memory 113. In FIG. 9, the same numbers are attached to the same units as those in FIGS. 1 and 4.

In the present embodiment, as illustrated in FIG. 9, while a power series operation to be used for distortion compensation is of the type of a plurality of power series, coefficients stored in the initial coefficient memory 113 in advance are those calculated based on single power series. When power fluctuates, coefficients are updated in the same manner as in the fourth embodiment.

In the present embodiment, distortion compensation performance may be improved by the pre-distortion method using a plurality of power series by being provided with the plurality of PD units 401 and also the amount of memory may be reduced by limiting coefficients held by the initial coefficient memory 113 to one group for each of the PD units 401.

Sixth Embodiment

Figure 10:
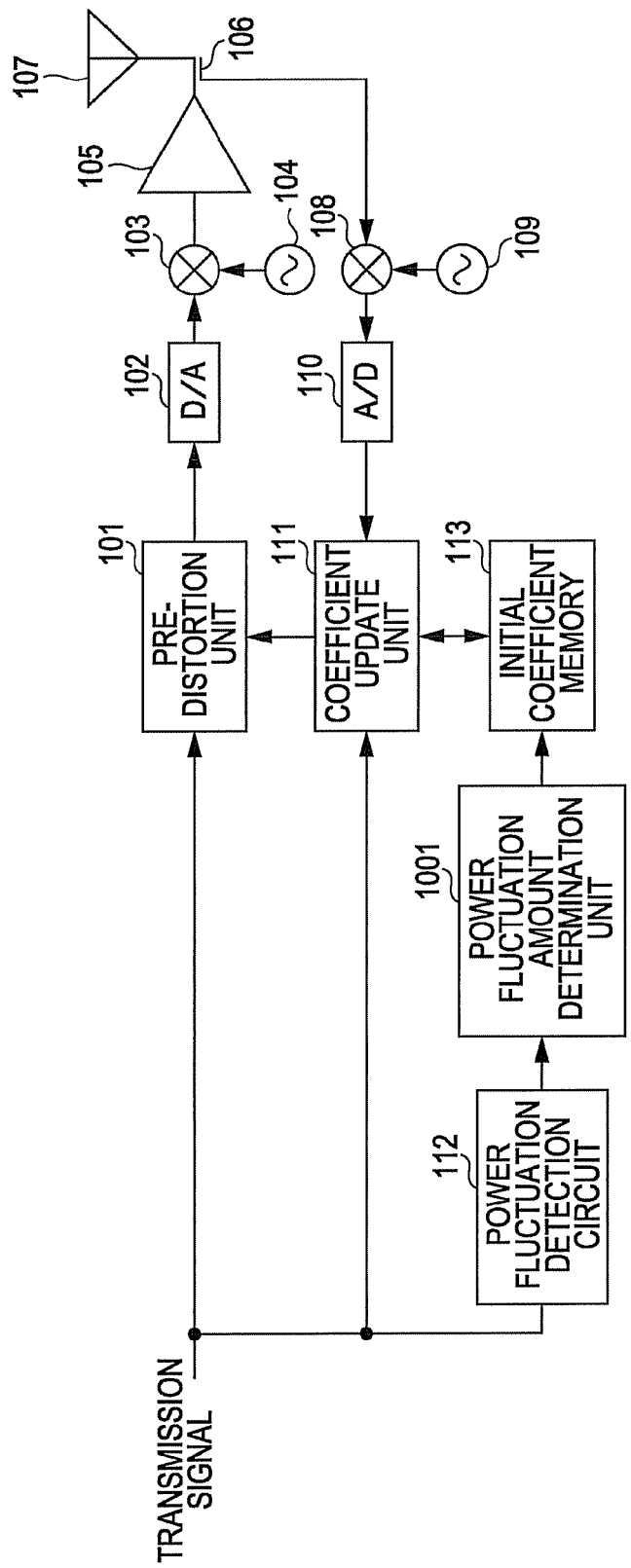
FIG. 10 is a configuration diagram in a sixth embodiment of the distortion compensation apparatus.

FIG. 10 is a configuration diagram in the sixth embodiment of the distortion compensation apparatus. The sixth embodiment is different from the first embodiment in FIG. 1 in the configuration concerning a power fluctuation amount determination unit 1001 provided subsequent to the power fluctuation detection circuit 112. In FIG. 10, the same numbers are attached to the same units as those in FIG. 1.

In FIG. 10, the power fluctuation amount determination unit 1001 provided subsequent to the power fluctuation detection circuit 112 determines whether to read coefficient groups from the initial coefficient memory 113 in accordance with a power fluctuation amount. Accordingly, when a power fluctuation is detected, the coefficient update unit 111 may use more appropriate values as initial values for coefficient update processing considering the power fluctuation amount.

The power fluctuation amount determination unit 1001 also reflects coefficient groups updated by the coefficient update unit 111 in the initial coefficient memory 113 when appropriate regardless of power fluctuations. Accordingly, coefficient groups are updated when appropriate so that coefficient groups in the coefficient update unit 111 become values matching utilization conditions.

In this case, coefficient groups reflected in the initial coefficient memory 113 are those corresponding to the current peak power. More specifically, if, for example, the coefficient update unit 111 performs a coefficient update based on the LMS algorithm, content of the initial coefficient memory 113 is updated each time.

Moreover, for example, after a fixed time passes, content of the initial coefficient memory 113 concerning coefficient groups updated by the coefficient update unit 111 is updated.

Further, for example, when a power fluctuation occurs, content of the initial coefficient memory 113 concerning coefficient groups corresponding to power before the fluctuation is updated.

Seventh Embodiment

Figure 11:
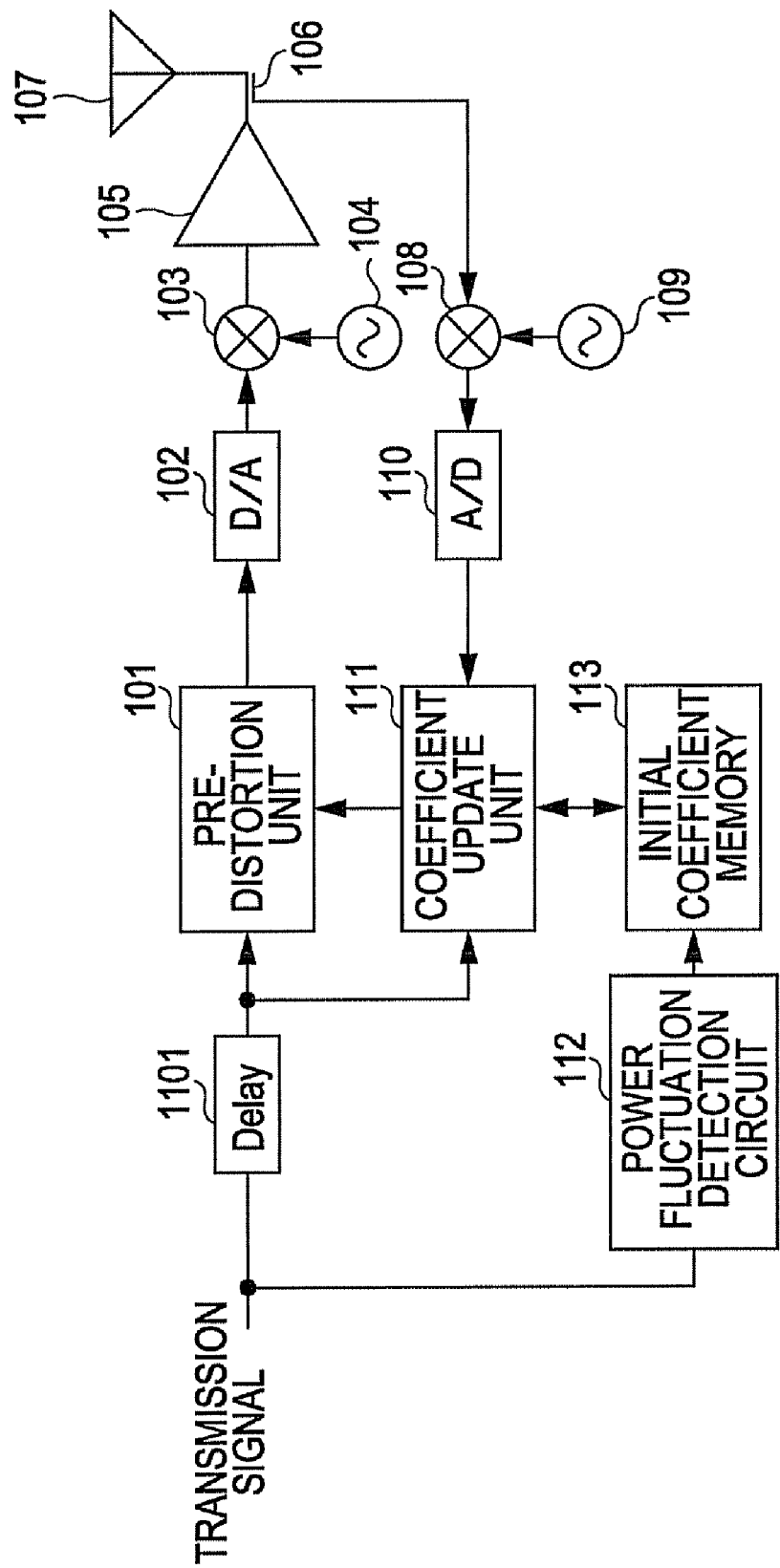
FIG. 11 is a configuration diagram in a seventh embodiment of the distortion compensation apparatus.
Figure 12:
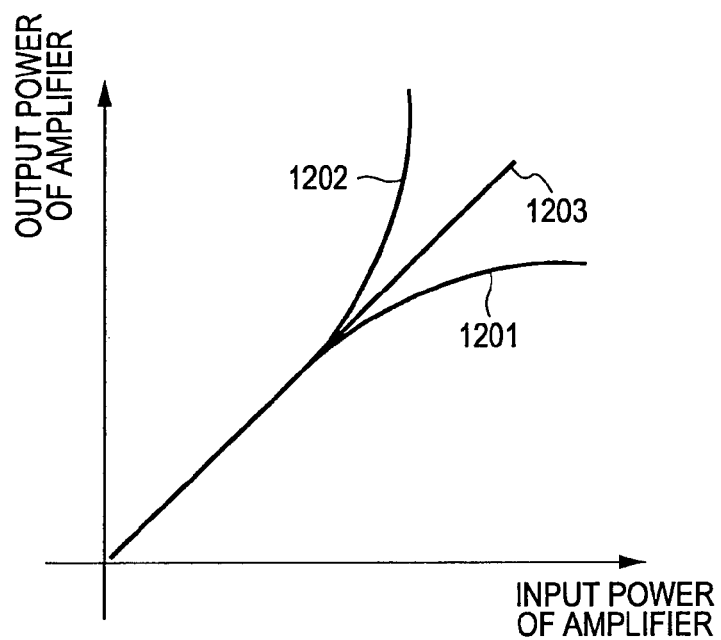
FIG. 12 is a diagram of principle of the pre-distortion method.

FIG. 11 is a configuration diagram in the seventh embodiment of the distortion compensation apparatus. The seventh embodiment is different from the first embodiment in FIG. 1 in the configuration concerning detection of a power fluctuation by the power fluctuation detection circuit 112. In FIG. 11, the same numbers are attached to the same units as those in FIG. 1.

In FIG. 11, a signal leading a pre-distortion signal processed by the pre-distortion unit 101 is used for detection of a power fluctuation by the power fluctuation detection circuit 112. That is, a signal obtained after a transmission signal is delayed by a delay unit (Delay) 1101 is input into the pre-distortion unit 101.

Accordingly, timing of a power fluctuation may be known in advance and coefficient groups may be input into the pre-distortion unit 101 in accordance with the timing so that the rise in out-of-band radiation power may be suppressed. When a power fluctuation is detected, the initial coefficient memory 113 is notified of coefficient change instructions at the same timing.

According to the above-described first to seventh embodiments, distortion compensation may be made in a state close to an ideal correction curve also immediately after the level of a transmission signal changes so that the rise in out-of-band radiation power may be suppressed.

All examples and conditional language recited herein are intended for pedagogical purposes to aid the reader in understanding the various embodiments and the concepts contributed by the inventor to furthering the art, and are to be construed as being without limitation to such specifically recited examples and conditions, nor does the organization of such examples in the specification relate to an illustration of the superiority and inferiority of the various embodiments.

Although the embodiment(s) of the present inventions have been described in detail, it should be understood that various changes, substitutions, and alterations could be made hereto without departing from the spirit and scope of the various embodiments.

What is claimed is:

1. A distortion compensation apparatus, comprising:
a distortion compensation unit that performs distortion compensation processing on a transmission signal by a series operation;
a coefficient update unit that updates a group of series operation coefficients used for the series operation based on a feedback signal of transmission signal output that is output after power amplification processing is performed on output of the distortion compensation unit and the transmission signal;
an initial coefficient memory that stores one or more groups of initial values for coefficient update processing by the coefficient update unit, the one or more groups of initial values relating to one or more groups of series operation coefficients used for the distortion compensation processing; and
a power fluctuation detection unit that detects a power fluctuation of the transmission signal and, when the power fluctuation is detected, reads one of the one or more groups of initial values from the initial coefficient memory and provides the one of the one or more groups of initial values to the coefficient update unit.

2. The distortion compensation apparatus according to claim 1, wherein the initial coefficient memory stores the corresponding group of series operation coefficients for each power level of the transmission signal, and
when the power fluctuation of the transmission signal is detected, the power fluctuation detection unit reads the group of series operation coefficients corresponding to the power level of the power fluctuation from the initial coefficient memory and provides the group of series operation coefficients to the coefficient update unit.

3. The distortion compensation apparatus according to claim 1, wherein the initial coefficient memory stores the group of series operation coefficients corresponding to a maximum power level of the transmission signal, and
when the power fluctuation of the transmission signal is detected, the power fluctuation detection unit reads the group of series operation coefficients corresponding to the maximum power level of the transmission signal from the initial coefficient memory and provides the group of series operation coefficients to the coefficient update unit.

4. The distortion compensation apparatus according to claim 1, wherein the distortion compensation unit performs distortion compensation processing by each of a plurality of series operation corresponding to each of a plurality of power ranges of the transmission signal respectively,
the coefficient update unit updates each group of series operation coefficients used for each of the series operations, and
the initial coefficient memory stores each group of series operation coefficients of each of the series operations that become the initial values for the coefficient update processing.

5. The distortion compensation apparatus according to claim 1, further comprising a power fluctuation determination unit that controls whether to change coefficients by the coefficient update unit in accordance with an amount of the power fluctuation when the power fluctuation detection unit detects the power fluctuation of the transmission signal.

6. The distortion compensation apparatus according to claim 1, wherein the groups of series operation coefficients stored in the initial coefficient memory are updated in accordance with coefficient update conditions by the coefficient update unit.

7. The distortion compensation apparatus according to claim 1, wherein the power fluctuation detection unit detects the power fluctuation for a transmission signal that temporally leads a transmission signal processed by the distortion compensation unit.

8. A distortion compensation method, comprising:
performing distortion compensation processing on a transmission signal by a series operation;
updating a group of series operation coefficients used for the series operation based on a feedback signal of transmission signal output that is output after power amplification processing is performed on output of the distortion compensation unit and the transmission signal;
causing an initial coefficient memory to store one or more groups of initial values for the updating, relating to one or more groups of series operation coefficients used for the distortion compensation processing; and
detecting a power fluctuation of the transmission signal to set one of the one or more groups of initial values read from the initial coefficient memory for the updating when the power fluctuation is detected.

9. The distortion compensation method according to claim 8, further comprising:
causing the initial coefficient memory to store the corresponding group of series operation coefficients for each power level of the transmission signal; and
when the power fluctuation of the transmission signal is detected, reading the group of series operation coefficients corresponding to the power level of the power fluctuation from the initial coefficient memory to set the group of series operation coefficients as the initial values of the update.

10. The distortion compensation method according to claim 8, further comprising:
causing the initial coefficient memory to store the group of series operation coefficients corresponding to a maximum power level of the transmission signal; and
when the power fluctuation of the transmission signal is detected, reading the group of series operation coefficients corresponding to the maximum power level of the transmission signal from the initial coefficient memory to set the group of series operation coefficients as the initial values of the update.

11. The distortion compensation method according to claim 8, further comprising:
performing distortion compensation processing by each of a plurality of series operation corresponding to each of a plurality of power levels of the transmission signal respectively;
updating each group of series operation coefficients used for each of the series operations; and
causing the initial coefficient memory to store each group of series operation coefficients of each of the series operations that become the initial values for the coefficient update processing.

12. The distortion compensation method according to claim 8, further comprising controlling whether to change coefficients by the coefficient update unit in accordance with an amount of the power fluctuation when the power fluctuation of the transmission signal is detected.

13. The distortion compensation method according to claim 8, further comprising updating the groups of series operation coefficients stored in the initial coefficient memory in accordance with coefficient update conditions by the update.

14. The distortion compensation method according to claim 8, further comprising detecting the power fluctuation for a transmission signal that temporally leads a transmission signal on which the distortion compensation processing is performed.

15. A radio transmission apparatus, comprising:
a distortion compensation unit that performs distortion compensation processing on a transmission signal by a series operation;
a power amplification unit that performs power amplification processing on output of the distortion compensation unit;
a transmission unit that transmits transmission signal output that is output from the power amplification unit;
a coefficient update unit that updates a group of series operation coefficients used for the series operation based on a feedback signal of the transmission signal output and the transmission signal;
an initial coefficient memory that stores one or more groups of initial values for coefficient update processing by the coefficient update unit, the one or more groups of initial values relating to one or more groups of series operation coefficients used for the distortion compensation processing; and
a power fluctuation detection unit that detects a power fluctuation of the transmission signal and, when the power fluctuation is detected and, reads one of the one or more groups of initial values from the initial coefficient memory and provides the one of the one or more groups of initial values to the coefficient update unit.

16. The radio transmission apparatus according to claim 15, wherein the initial coefficient memory stores the corresponding group of series operation coefficients for each power level of the transmission signal, and
when the power fluctuation of the transmission signal is detected, the power fluctuation detection unit reads the group of series operation coefficients corresponding to the power level of the power fluctuation from the initial coefficient memory and provides the group of series operation coefficients to the coefficient update unit.

17. The radio transmission apparatus according to claim 15, wherein the initial coefficient memory stores the group of series operation coefficients corresponding to a maximum power level of the transmission signal, and
when the power fluctuation of the transmission signal is detected, the power fluctuation detection unit reads the group of series operation coefficients corresponding to the maximum power level of the transmission signal from the initial coefficient memory and provides the group of series operation coefficients to the coefficient update unit.

18. The radio transmission apparatus according to claim 15, wherein the distortion compensation unit performs distortion compensation processing by each of a plurality of series operation corresponding to each of a plurality of power ranges of the transmission signal respectively,
the coefficient update unit updates each group of series operation coefficients used for each of the series operations, and
the initial coefficient memory stores each group of series operation coefficients of each of the series operations that become the initial values for the coefficient update processing.

19. The radio transmission apparatus according to claim 15, further comprising a power fluctuation determination unit that controls whether to change coefficients by the coefficient update unit in accordance with an amount of the power fluctuation when the power fluctuation detection unit detects the power fluctuation of the transmission signal.

20. The radio transmission apparatus according to claim 15, wherein the groups of series operation coefficients stored in the initial coefficient memory are updated in accordance with coefficient update conditions by the coefficient update unit.

21. The radio transmission apparatus according to claim 15, wherein the power fluctuation detection unit detects the power fluctuation for a transmission signal that temporally leads a transmission signal processed by the distortion compensation unit.

22. A digital signal processor, comprising:
a distortion compensation circuit that performs distortion compensation processing on a transmission signal by a series operation;
a coefficient update circuit that updates a group of series operation coefficients used for the series operation based on a feedback signal of transmission signal output that is output after power amplification processing is performed on output of the distortion compensation circuit and the transmission signal;
a storing circuit that causes a memory to store one or more groups of initial values for coefficient update processing by the coefficient update circuit, the one or more groups of initial values relating to one or more groups of series operation coefficients used for the distortion compensation processing; and
a power fluctuation detection circuit that detects a power fluctuation of the transmission signal and, when the power fluctuation is detected, reads one of the one or more groups of initial values from the memory and provides the one of the one or more groups of initial values to the coefficient update circuit.

* * * * *